United States Patent [19]

Fujimoto

[11] 3,770,530

[45] Nov. 6, 1973

[54] METHOD OF ETCHING COPPER AND ALLOYS THEREOF

[75] Inventor: Osamu Fujimoto, Fuji, Japan

[73] Assignee: Tokai Denka Kogyo Kabushiki Kaisha, Tokyo, Japan

[22] Filed: Sept. 24, 1971

[21] Appl. No.: 183,618

[30] Foreign Application Priority Data

Apr. 26, 1971 Japan .............................. 46/26697

[52] U.S. Cl. .................... 156/3, 252/79.4, 117/47 A

[51] Int. Cl. ......................... H05k 3/06, B44d 1/092

[58] Field of Search ................. 156/3, 18; 252/79.4, 252/390; 117/47 A

[56] References Cited

UNITED STATES PATENTS

| | | | |
|---|---|---|---|
| 3,476,624 | 11/1969 | Hogya et al. | 156/13 |
| 3,663,436 | 5/1972 | Carswell | 252/28 |

*Primary Examiner*—Jacob H. Steinberg
*Attorney*—Wynne and Finken

[57] ABSTRACT

A method of etching copper, or its alloys, with an acidic aqueous etching solution containing peroxysulfate and containing an additive which is an azole of the following structures:

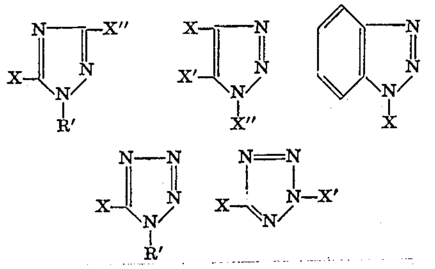

wherein X, X' and X'' which may be the same or different represent any one of hydrogen, amino group, aminoalkyl group having one to three carbon atoms, and alkyl group having one to three carbon atoms; and, if required, one or more halides as a secondary component. The use of such etching solution results in an accelerated etching rate.

6 Claims, No Drawings

METHOD OF ETCHING COPPER AND ALLOYS THEREOF

The present invention relates to a method of etching copper and alloys thereof by using an acidic solution of peroxysulfate. More particularly, it relates to an etching solution containing an additive which serves to increase the rate of etching.

Etching of copper and alloys thereof has been widely utilized in the field of printed circuit plates, printing plates, electrical components, etc. For example, in the production of printed electrical circuit plates, an electrically conductive metal foil (normally of copper) is adhered onto an electric insulating material such as, e.g., epoxy or phenol resin, then, a part of surface of the foil which later forms a circuit is covered with a resist material which is unsusceptible to corrosion by an etching solution and the remaining portion of the foil which is not covered with the resist material is etched to prepare a printed electric circuit plate. While the resist materials generally in use include ink, organic photosensitive resins, etc, in recent years, demands for through-hole printed circuit plates used for industrial electronic apparatus are increasing and the use of metallic resist materials such as solder, gold, gold-nickel alloy, rhodium, tin, tin-nickel alloy and the like is becoming more and more popular.

Etching agents employed for etching copper and alloys thereof generally include a solution of peroxysulfate, a mixed solution of hydrogen peroxide and sulfuric acid, a mixed solution of chromic anhydride and sulfuric acid, a solution of ferric chloride, a solution of cupric chloride or a solution of sodium chlorite.

Of these etching agents known heretofore, when a mixed solution of chromic anhydride and sulfuric acid, or a solution of ferric chloride is used, there is produced a waste liquid containing large amounts of metallic ions of dissolved copper and chromium, or copper and iron, respectively. Because of great difficulties encountered in removing these metals completely and at the same time from the waste liquid, the treatment and disposition of such waste liquids are creating a big social problem.

In contrast, a solution of peroxysulfate is a mild and preferable etching agent in that it produces no obnoxious gas and can be handled easily. Moreover, the only metal contained in the etching waste liquid is copper alone so that, unlike a mixed solution of chromic anhydride and sulfuric acid or a solution ferric chloride, removing of copper from the waste is simple. Furthermore, it is possible to recover the etching waste for reuse and, being substantially free of drawbacks appertain to other etching agents, this particular etching agent is considered preferable to others.

However, since a mercury salt catalyst which serves to increase the rate of etching is used, though in an extremely small amount, for this peroxysulfate etching agent, there is involved a problem of contamination of rivers with mercury, and it is desired that some other substances be substituted for mercury salt.

There have already been accumulated quite a number of findings with regard to etching of metal surface with the use of peroxysulfate solution incorporated with a mineral acid such as, e.g., sulfuric acid, phosphoric acid, etc. For example, Japanese Patent Publication No. 9463/64 discloses etching with the use of peroxymonosulfate solution; and Japanese Patent Publications Nos. 1620/61, 16008/61, 27517/64, 16409/65 and 11324/66 describe etching with the use of peroxydisulfate solution.

In order to practice etching on an industrial scale with the use of an etching solution of peroxysulfate, there is a necessity of incorporating thereinto a substance which enhances the rate of etching. For this purpose, an incorporation of extremely small amounts of mercury salt into the etching solution has been widely adopted nowadays. While mercury is to be sure a remarkably effective material to enhance the rate of etching, since it is invariably used when preparing an etching solution even though the amounts used are extremely small, if it is discharged into rivers as a waste liquid, there is a possibility of raising a problem of contamination of rivers. Accordingly, when mercury is employed, there are required means for removing mercury from the waste liquid. However, such means for complete removal of mercury imply an additional process and bothersome operation. For these reasons, although the use of mercury shows an excellent effect, there has been desired a catalyst which substitutes for mercury from the standpoint of pollution.

An object of the present invention resides in providing a peroxysulfate solution used for etching of copper and alloys thereof which contains an additive for remarkably increasing the rate of etching of these metals. The additive referred to should be capable of remarkably increasing the rate of etching and maintaining the effect for a prolonged period of time; inexpensive and such that causes no contamination of rivers in terms of secondary pollution.

As a result of an extensive study conducted by the present inventors on a method of etching copper and alloys thereof with the use of an acidic peroxysulfate solution, it has now been found that a remarkable effect in increasing the rate of etching is obtained with the use of an acidic peroxysulfate etching solution containing an additive consisting of, as a primary component, azoles of the general formulae;

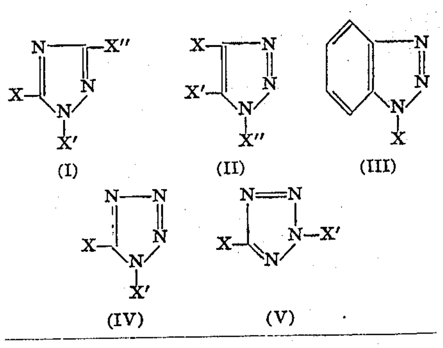

wherein X, X' and X'' which may be the same or different represent any one of hydrogen, amino group, aminoalkyl group having one to three carbon atoms, and alkyl group having one to three carbon atoms; and, if required, as a secondary component, halides.

Azoles represented by the general formula (I) which may be used in the present invention include, for example, 1,2,4-triazole, 3-methyl-1,2,4-triazole, 3,5-dimethyl-1,2,4-triazole, 1-amino-1,2,4-triazole, 3-amino-1,2,4-triazole, 5-amino-3-methyl-1,2,4-triazole, 3-($\beta$-aminoethyl)-1,2,4-triazole and 3-isopropyl-1,2,4-triazole.

Azoles represented by the general formula (II) which may be used in the present invention include, for example, 1,2,3-triazole, 1-methyl-1,2,3-triazole, 1-amino-1,2,3-triazole, 1-amino-5-methyl-1,2,3-triazole, 4,5-dimethyl-1,2,3-triazole, 1-amino-5-(n) propyl-1,2,3-triazole and 1-(β-aminoethyl)-1,2,3-triazole.

Azoles represented by the general formula (III) which may be used in the present invention include, for example, benzotriazole, 1-methylbenzotriazole, 1-amino-benzotriazole and 1-ethyl-benzotriazole.

Azoles represented by the general formulae (IV) and (V) which may be used in the present invention include, for example, tetrazole, 1-methyl-tetrazole, 2-methyl-tetrazole, 5-amino-tetrazole, 5-amino-1-methyl-tetrazole and 1-(β-aminoethyl)-tetrazole.

Halides which may be used in the present invention include those capable of liberating halogen ions into the etching solution or those susceptible to oxidative decomposition by peroxysulfate to liberate halogen ions or gas. For example, there are included inorganic halides such as hydrofluoric acid and salts thereof, hydrochloric acid and salts thereof, hydrobromic acid and salts thereof and hydroiodic acid and salts thereof, oxides of fluorine, chlorine, bromine and iodine; oxyacids of chlorine, bromine and iodine including salts thereof; and organic halides such as di-chlorocyanuric acid and salts thereof, 1-chlorodiethyl ether and organic acid halides.

In accordance with the present invention, it has been found that when azoles defined herein which constitute a primary component of the additive, either alone or in various combination with halides which constitute a secondary component of the additive, are dissolved in the etching solution, there is brought about a remarkable increase in the rate of etching.

Even when azoles defined herein alone are incorporated into a peroxysulfate etching solution, there is recognized a considerable effect as compared with the case wherein no additive is employed, and, in fact, it generally suffices to accomplish the object of the present invention. However, it is acknowledged that the use of halides of the secondary component in combination therewith affords an even greater effect and practical utility.

Incorporation of halides alone into a peroxysulfate etching solution results in decreasing in the rate of etching. Accordingly, it is clear that the remarkable enhancement in the rate of etching is experienced by the use of azoles defined herein as a primary component alone, or the combination use of the primary component and halides as a secondary component. Quite unexpectedly, it has been found that in the etching solution according to the present invention, the rate of etching and general etching performances are even higher and better than in mercury catalyst-containing etching solution known heretofore.

In carrying out etching according to the method of the present invention, one or more of azoles of the general formulae shown hereinbefore which constitute a primary component of the additive are incorporated into an etching solution in an amount of from 5 ppm. to the maximum solubility, preferably 10–10,000 ppm., or, in addition to the primary component in amounts mentioned above, one or more of halides as a secondary component in an amount of from 0.1 ppm. to 1,000 ppm., preferably from 0.1 ppm. to 50 ppm., in the form of halogen ion.

While the incorporation of these additives in peroxysulfate etching solution involves a method wherein azoles defined herein as a primary component and halides as a secondary component are added to the etching solution separately, and another method wherein an aqueous solution containing the primary and secondary components prepared beforehand is added to the etching solution, an excellent etching performance may be obtained in either methods.

In the present invention, although incorporation of azoles defined herein as a primary component and halides as a secondary component in excessive amounts causes no substantial inconvenience and the rate of etching can be invariably and satisfactorily maintained, such excessive addition of course is economically disadvantageous.

So far as halides as a secondary component are concerned, when they are incorporated into peroxysulfate etching solution along with the primary component, the presence thereof in extremely small amounts brings about a surprising increase in the rate of etching. Thus, amounts of halides added may be quite small.

The incorporation of chlorides into a peroxysulfate solution for etching copper has already been proposed in Japanese Patent Publication No. 27517/64 with regard to etching of photographic printing plates. In this instance, however, amounts of chlorides added are quite large, e.g., concentration of several percent or more. Moreover, there is a necessity of keeping on addition of supplemental amounts of chlorides and a satisfactory rate of etching cannot be obtained unless the concentration of chlorides in the etching solution ultimately reaches a percentage in the order of several tens.

In contrast, in the present invention, halides merely serve as a secondary component of the additive and the amounts used are quite minimal as compared with the prior art referred to above, i.e., in the order of one thousandth of amounts used therein. Furthermore, the present invention shows a superiority over the prior art referred to above in that the rate of etching is at least three times greater and an etch factor referred to hereinafter is at least twice greater than in the prior art. Thus, the present invention could not possibly be inferred from the disclosure of the prior Patent Publication mentioned above.

In the use of a mercury catalyst known heretofore, it is known well that an intermixing of chlorides, e.g., those contained in municipal water supply systems, causes such inconveniences as drastic degradation in the rate of etching, generation of malodors, etc. In contrast, it has been found that in the additive of the present invention the presence of chlorides causes no such inconveniences but, to the contrary, it affords a remarkable enhancement in the effect of the primary component.

While these additives used in the present invention have an excellent stability, if azoles defined herein remain in a peroxysulfate etching solution for a prolonged period of time, they turn into degenerated products due to gradual oxidative decomposition caused by strong oxidation power of peroxysulfate. Similarly, halides of the secondary component are also gradually oxidized to generate halogen gases.

As azoles defined herein are subjected to oxidative decomposition by peroxysulfate with a result of turning into degenerated products and the gradual oxidative decomposition of halides also occurs, a decrease in the rate of etching takes place. However, the decreased rate of etching can be immediately remedied and the original rate is reproducible by adding to the etching solution azoles defined herein alone, or, in combination with halides of the secondary component.

As described above, so long as there is present in the etching solution azoles defined herein alone or in combination with halides as a secondary component, even if these azoles are decomposed by oxidation with attendant gradual accumulation of the resulting degenerated products in the etching solution, it has been found that there is caused no hindrance to a satisfactory etching but rather these degenerated products serve to increase chemical stability of azoles defined herein with favorable effect in making amounts of azoles to be supplemented freshly less and less.

When etching is carried out for several weeks by employing an etching solution containing azoles defined herein alone or in combination with halides, there may be observed a decrease in the rate of etching which results from a decrease in the concentration of peroxysulfate in the etching solution caused by reaction of peroxysulfate with copper. Thus, the decrease in the rate of etching in this instance has nothing to do with the additives and it can readily be recovered by an addition of peroxysulfate, free from an adverse effect and hindrance resulting from the accumulation of copper.

Upon etching copper and alloys thereof in the production of printed circuit base plates, etc., a number of factors have to be taken into consideration. Some of the important factors include the rate at which an etching agent dissolves copper; etch factor; appearance of metal resist surface after etching; temperature at which etching is performed; and effects of etching solution and additives on materials of printed circuit base plate and etching equipment. Etching according to the present invention satisfies all these criteria.

In regard to the rate at which the etching agent dissolves copper, by the incorporation of the additives of the present invention into the etching solution, copper is etched at a rate of 17–45 per minutes. This rate is surprisingly 5 to 15 times greater than in case wherein no additive of the present invention is employed and the rate normally ranges 3–4 per minute.

Etch factor referred to herein defines the ratio of perpendicular etched depth to the maximum inside encroachment underneath a resist as measured from the etched perpendicular plane. The etch factor in the present invention ranges 2.5–3.5 as compared with the value of 0.3–0.4 obtained with the use of no additive. Thus, the method of the present invention is suitable for the production of precision print circuit base plates involving an extremely fine circuit width.

When etching a printed circuit base plate involving a metal resist according to the present invention, an excellent etching can be accomplished without observing any discoloration of the metal resist surface.

As far as etching temperature is concerned, it is preferable to carry out the etching operation at low temperatures in view of the fact that conventional etching equipment mainly comprises plastic materials. With the use of additive of the present invention, a high rate of etching is attainable at such low temperatures that are inconceivable when using conventional mercury catalysts known heretofore. Thus, the etching according to the present invention can be conveniently carried out at room temperature.

The method of etching according to the present invention gives no particular effects on materials of print circuit base plate and etching equipment employed so that it is applicable to any conventional materials and equipment.

Copper and alloys thereof to which etching according to the present invention is applicable include copper, brass, bronze, beryllium copper, constantan and the like.

Peroxysulfates used in the present invention include ammonium, potassium, sodium and lithium peroxymonosulfates; and ammonium, potassium, sodium, barium, lithium and strontium peroxydisulfates. Of these, particularly preferable for use in the present invention are ammonium peroxymonosulfate and ammonium peroxydisulfate.

In etching copper and alloys thereof according to the present invention, the etching solution contains a peroxysulfate in an amount of from 5 wt. percent to the maximum solubility, preferably from 5 to 25 wt. percent, and, if required, either one or both of ortho phosphoric acid and sulfuric acid in an amount of from 0.5 to 15 wt. percent, and further contains an additive comprising one or more of azoles defined herein as a primary component in an amount of from 5 ppm. to the maximum solubility, preferably from 10 to 10,000 ppm., either alone or in combination with one or more of halides in an amount of from 0.1 ppm. to 1,000 ppm., preferably from 0.1 ppm. to 50 ppm. in the form of halogen ions.

Etching temperature employed in the present invention ranges from 20° to 80°C., preferably from 20° to 50°C. Injudicious raising of etching temperature in an attempt to accelerate the rate of etching is not preferable, since it adversely affects persistency of the rate of etching as a result of accelerated decomposition of peroxysulfate and accelerated oxidation, decomposition and volatilization of zoles defined herein and halides which are components of the additive.

Etching according to the method of the present invention affords remarkable improvements in finish conditions as compared with the case wherein no additive is employed. Moreover, in contrast to the etching with the use of a mercury catalyst, the method of the present invention not only exhibits superiorities thereover in terms of the etching rate and finish but also completely diminishes the possibility of contaminating rivers with mercury.

The present invention will be further explained more concretely in conjunction with working Examples in the following. It should not be construed, however, that these Examples restrict the scope of the present invention in any way as they are given merely by way of illustration:

Examples 1–9

A circuit pattern was prepared by applying an organic photosensitive resist onto a copper lined laminate plate measuring 5 cm. × 5 cm. in which copper foil 35 μ was closely laminated, placing a photographic negative on the resulting substrate, effecting exposure by using a mercury lamp and removing an unexposed portion by washing with a mixed solvent of trichloroethylene and methylene chloride.

There was prepared a solution containing 250 g/liter of ammonium peroxydisulfate and 50 ml/liter of 75 wt.

percent aqueous solution of ortho phosphoric acid. To the resulting solution was added as an additive 3-amino-1,2,4-triazole either alone or in combination with sodium chloride in various amounts to give etching solutions. Etching was carried out by employing these etching solutions and a rotating disc type spray etcher at a temperature of 40°C. and with a spray pressure of 0.5 kg./cm.$^2$.

After completion of the etching, the base plate was cut and embedded into a resin to measure an etch factor. The measurement was done by examining the etched part of copper foil under a microscope to ascertain the ratio of perpendicular etched depth to the maximum encroachment underneath the resist from the etched perpendicular plane.

The results are tabulated in the following Table 1.

TABLE 1

| Example Nos. | Type of additive: 3-amino-1,2,4-triazole (p.p.m.) | Type of additive: Sodium chloride (p.p.m.) | Etching rate (μ/min) | Etch factor |
|---|---|---|---|---|
| 1 | 100 | | 17.3 | 1.9 |
| 2 | 1,000 | | 20.1 | 2.2 |
| 3 | 100 | 16 | 36.2 | 3.0 |
| 4 | 200 | 16 | 36.0 | 2.8 |
| 5 | 300 | 16 | 36.3 | 3.2 |
| 6 | 300 | 48 | 35.8 | 3.0 |
| 7 | 300 | 80 | 36.2 | 3.2 |
| 8 | 300 | 160 | 37.0 | 3.0 |
| 9 | 300 | 320 | 36.0 | 3.1 |
| Comparative: | | | | |
| 1 | | | 3.2 | 0.3 |
| 2 | | 16 | 2.0 | .1 |

Examples 10–23

A circuit pattern as used in Examples 1–9 was prepared and etching was conducted by employing the same etcher and etching conditions as described in Examples 1–9 except that the etching solution contained different types of additives in various amounts as shown in the following Table 2. The rate of etching and etch factor were measured with results tabulated in Table 2.

TABLE 2

| Example Nos. | Type of additives | Amount added (p.p.m.) | Etching rate (μ/min) | Etch factor |
|---|---|---|---|---|
| 10 | 3-amino-1,2,4-triazole<br>Hydrochloric acid | 300<br>10 | 35.1 | 3.0 |
| 11 | 3-amino-1,2,4-triazole<br>Ammonium chloride | 300<br>15 | 33.8 | 3.1 |
| 12 | 3-amino-1,2,4-triazole<br>Sodium hypochlorite | 300<br>21 | 34.5 | 3.2 |
| 13 | 3-amino-1,2,4-triazole<br>Potassium bromide | 300<br>15 | 34.0 | 3.1 |
| 14 | 3-amino-1,2,4-triazole<br>Potassium bromate | 300<br>21 | 35.5 | 3.1 |
| 15 | 3-amino-1,2,4-triazole<br>Potassium dichloroisocyanurate | 200<br>33 | 31.3 | 3.0 |
| 16 | 1-amino-1,2,3-triazole | 200 | 19.3 | 2.1 |
| 17 | 1-amino-1,2,3-triazole<br>Sodium chloride | 200<br>16 | 32.0 | 2.8 |
| 18 | Benzotriazole | 100 | 16.4 | 2.0 |
| 19 | Benzotriazole<br>Sodium chloride | 100<br>16 | 20.3 | 2.1 |
| 20 | 5-amino-tetrazole | 100 | 18.1 | 1.9 |
| 21 | 5-amino-tetrazole<br>Sodium chloride | 100<br>16 | 21.2 | 2.3 |
| 22 | 3-amino-1,2,4-triazole<br>1-amino-1,2,3-triazole<br>Sodium chloride | 300<br>300<br>16 | 35.2 | 3.2 |
| 23 | 3-amino-1,2,4-triazole<br>Sodium chloride<br>Potassium bromide | 300<br>16<br>15 | 34.2 | 3.2 |

Examples 24–35

A circuit pattern as used in Examples 1–9 was prepared and etching was conducted by employing an etching solution containing 250 g./liter of sodium peroxydisulfate and 50 ml/liter of 75 wt. percent aqueous solution of ortho phosphoric acid, into which various types and amounts of additives as specified in the following Table 3 were incorporated. The rate of etching and etch factor were measured with results tabulated in Table 3.

TABLE 3

| Example Nos. | Type of additives | Amount added (p.p.m.) | Etching rate (μ/min) | Etch factor |
|---|---|---|---|---|
| 24 | 3-amino-1,2,4-triazole | 1,000 | 18.5 | 2.0 |
| 25 | 3-amino-1,2,4-triazole<br>Sodium chloride | 300<br>16 | 34.2 | 3.0 |
| 26 | 3-methyl-1,2,4-triazole | 200 | 18.1 | 2.1 |
| 27 | 3-methyl-1,2,4-triazole<br>Ammonium chloride | 200<br>15 | 33.7 | 3.0 |
| 28 | 3-amino-1,2,4-triazole<br>1-amino-1,2,3-triazole<br>Sodium chloride | 300<br>300<br>16 | 33.5 | 3.0 |
| 29 | 3-amino-1,2,4-triazole<br>Potassium bromide | 300<br>15 | 36.5 | 3.2 |
| 30 | 1-amino-1,2,3-triazole | 300 | 17.3 | 2.0 |
| 31 | 1-amino-1,2,3-triazole<br>Sodium chloride | 300<br>16 | 32.5 | 2.9 |
| 32 | 1-amino-benzotriazole | 500 | 18.1 | 2.0 |
| 33 | 1-amino-benzotriazole<br>Sodium chloride | 500<br>16 | 33.8 | 2.9 |
| 34 | 5-amino-1-methyl-tetrazole | 500 | 16.8 | 1.7 |
| 35 | 5-amino-1-methyl-tetrazole<br>Sodium chloride | 500<br>16 | 30.4 | 2.8 |
| Comparative 3 | | | 2.6 | 0.3 |

Examples 36–43

A circuit pattern as used in Examples 1–9 was prepared and etching was conducted by employing an etching solution containing 100 g./liter of ammonium peroxymonosulfate and 50 g./liter of sulfuric acid, into which various types and amounts of additives as specified in the following Table 4 were incorporated. The ratio of etching and etch factor were measured with results tabulated in Table 4.

Examples 44–49

Etching was conducted according to the same procedures as described in Examples 1–9 except that a brass plate (consisting of 80 percent Cu and 20 percent Zn) was used instead of 35 μ copper lined laminated plate. The following Table 5 shows the types and amounts of additives used and the results of measurement on the rate of etching.

TABLE 4

| Example Nos. | Type of additives | Amount added (p.p.m.) | Etching rate (μ/min) | Etch factor |
|---|---|---|---|---|
| 36 | 3-amino-1,2,4-triazole | 100 | 26.5 | 2.3 |
| 37 | 3-amino-1,2,4-triazole | 1,000 | 27.3 | 2.4 |
| 38 | 3-amino-1,2,4-triazole<br>Sodium chloride | 300<br>16 | 45.2 | 3.5 |
| 39 | 3-amino-1,2,4-triazole<br>Potassium iodide | 300<br>13 | 43.5 | 3.4 |
| 40 | 5-amino-tetrazole<br>Sodium chloride | 100<br>16 | 31.0 | 2.8 |
| 41 | 3-amino-1,2,4-triazole<br>1-amino-1,2,3-triazole<br>Sodium chloride | 300<br>300<br>16 | 44.5 | 3.3 |
| 42 | 1-amino-5-methyl-1,2,3-triazole | 200 | 16.5 | 1.9 |
| 43 | 1-amino-5-methyl-1,2,3-triazole<br>Sodium chloride | 200<br>16 | 31.8 | 2.9 |
| Comparative 4 | | | 8.3 | 1.2 |

TABLE 5

| Example Nos. | Type of Additives | Amount Added (ppm) | Etching Rate (μ/min.) |
|---|---|---|---|
| 44 | 3-amino-1,2,4-triazole<br>Sodium chloride | 300<br>16 | 23.9 |
| 45 | 3-amino-1,2,4-triazole<br>Potassium bromate | 300<br>21 | 24.5 |
| 46 | 1-amino-5-methyl-triazole<br>Sodium chloride | 500<br>16 | 25.1 |
| 47 | Benzotriazole<br>Sodium chloride | 500<br>16 | 22.8 |
| 48 | 5-amino-tetrazole<br>Sodium chloride 16 | 500 | 23.4 |
| 49 | 2-methyl-tetrazole<br>Sodium chloride 16 | 500 | 23.8 |
| Comparative 5 | | | 2.2 |

Examples 50–61

A circuit pattern as used in Examples 1–9 was prepared by using a solder resist consisting of 60 percent tin and 40 percent lead instead of the organic photosensitive resist used in these Examples. Etching was conducted according to the same procedures and under the same etching conditions as in Examples 1–9. The rate of etching and etch factor were measured with results tabulated in the following Table 6:

azoles having structures represented by the general formulae:

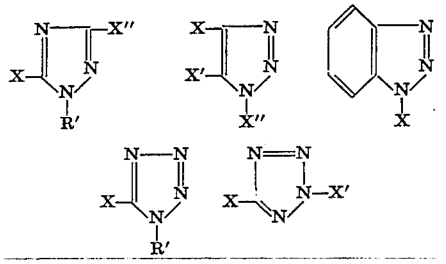

wherein X, X′ and X″ which may be the same or different represent any one of hydrogen, amino group, aminoalkyl group having one to three carbon atoms, and alkyl group having one to three carbon atoms; and, if required, one or more halides as a secondary component.

2. Method according to claim 1 wherein said azoles being selected from the group consisting of 1,2,4-triazole, 3-methyl-1,2,4-triazole, 3,5-dimethyl-1,2,4-

TABLE 6

| Example Nos. | Type of additives | Amount added (p.p.m.) | Etching rate (μ/min) | Etch factor | Appearance of solder surface |
|---|---|---|---|---|---|
| 50 | 3-amino-1,2,4-triazole | 100 | 17.3 | 1.9 | Bright. |
| 51 | 3-amino-1,2,4-triazole | 1,000 | 20.1 | 2.2 | Do. |
| 52 | 3-amino-1,2,4-triazole<br>Sodium chloride | 300<br>16 | 36.3 | 3.0 | Do. |
| 53 | 3-amino-1,2,4-triazole<br>Potassium bromide | 300<br>15 | 34.0 | 2.8 | Do. |
| 54 | 3-amino-1,2,4-triazole<br>1-amino-1,2,3-triazole<br>Sodium chloride | 300<br>300<br>16 | 35.2 | 3.1 | Do. |
| 55 | 3-amino-1,2,4-triazole<br>Sodium chloride<br>Potassium bromide | 300<br>16<br>15 | 34.2 | 3.0 | Do. |
| 56 | 3-amino-1,2,4-triazole<br>Dichloroisocyanuric acid | 300<br>33 | 31.3 | 3.0 | Do. |
| 57 | 1-amino-5-methyl-1,2,3-triazole<br>Sodium chloride | 300<br>16 | 32.5 | 2.9 | Do. |
| 58 | Benzotriazole<br>Sodium chloride | 100<br>16 | 20.3 | 2.1 | Do. |
| 59 | 5-amino-tetrazole<br>Sodium chloride | 100<br>16 | 21.2 | 2.3 | Do. |
| 60 | 5-amino-1-methyl-tetrazole<br>Sodium chloride | 300<br>16 | 21.4 | 2.0 | Do. |
| 61 | 1-amino-1,2,3-triazole<br>Acetyl bromide | 300<br>15 | 20 | 2.3 | Do. |
| Comparative 6 | | | 3.2 | 0.3 | Slightly gray. |

I claim:

1. Method of etching copper and alloys thereof which comprises conducting the etching by employing an acidic aqueous etching solution containing peroxysulfate, said etching solution further containing an additive comprising as a primary component at least one of triazole, 1-amino-1,2,4-triazole, 3-amino-1,2,4-triazole, 5-amino-3-methyl-1,2,4-triazole, 3-(β-aminoethyl)-1,2,4-triazole, 3-isopropyl-1,2,4-triazole, 1,2,3-triazole, 1-methyl-1,2,3-triazole, 1-amino-1,2,3-triazole, 1-amino-5-methyl-1,2,3-triazole, 4,5-dimethyl-1,2,3-triazole, 1-amino-5-(n)propyl-1,2,3-triazole, 1-(β-aminoethyl)-1,2,3-triazole, benzotriazole, 1-methyl-benzotriazole, 1-amino-benzotriazole, 1-ethyl-benzotriazole, tetrazole, 1-methyl-tetrazole, 2-methyl-tetrazole, 5-amino-tetrazole, 5-amino-1-methyl-tetrazole and 1-(β-aminoethyl)-tetrazole.

3. Method according to claim 1 wherein said halides being selected from the group consisting of hydrofluoric acid and salts thereof; hydrochloric acid and salts thereof; hydrobromic acid and salts thereof; hydroiodic acid and salts thereof; oxides of fluorine, chlorine, bromine and iodine; oxyacids of chlorine, bromine and iodine including salts thereof; dichloroisocyanuric acid and salts thereof; 1-chlorodiethyl ether and organic acid halides.

4. A method according to claim 1 wherein the etching solution contains the peroxysulfate in the concentration of from 5 weight percent to the maximum solubility in the etching solution at a temperature employed, the azoles in the concentration of 10–10,000 PPM and the halides in the concentration of 0.1–1,000 PPM.

5. A method according to claim 1 wherein copper and alloys thereof are adhered in the form of foils onto an electric insulating material such as epoxy or phenol resin and a part of surface of the foil which later forms a printed circuit after etching is covered with a resist film on said foil-shaped copper and alloys thereof.

6. A method according to claim 5 wherein the resist film is composed of at least one material selected from the group consisting of ink, organic photosensitive resins, solder, gold, gold-nickel alloy, rhodium, tin and tin-nickel alloy.

* * * * *